United States Patent [19]

Kegasa

[11] Patent Number: 4,940,952
[45] Date of Patent: Jul. 10, 1990

[54] PHASE AND FREQUENCY COMPARATOR CIRCUIT FOR PHASE LOCKED LOOP

[75] Inventor: Koyo Kegasa, Amagasaki, Japan

[73] Assignee: Mitsubishi Denki Kabushiki Kaisha, Hyogo, Japan

[21] Appl. No.: 267,549

[22] Filed: Nov. 7, 1988

[30] Foreign Application Priority Data

Nov. 9, 1987 [JP] Japan ................... 62-282821

[51] Int. Cl.⁵ ............... H03D 13/00; H03L 7/087; H03L 7/10
[52] U.S. Cl. ........................ 331/11; 331/14; 331/17; 331/26; 331/27; 307/516; 307/526; 328/134; 328/155
[58] Field of Search ........... 331/1 A, 11, 12, 14, 331/17, DIG. 2, 25, 26, 27; 307/510, 514, 516, 519, 526; 328/133, 134, 155

[56] References Cited

U.S. PATENT DOCUMENTS

| | | | |
|---|---|---|---|
| 3,716,802 | 2/1973 | Muratani et al. | 331/26 X |
| 4,069,462 | 1/1978 | Dunn | 331/11 |
| 4,155,050 | 5/1979 | Nichols | 331/1 A X |
| 4,404,530 | 9/1983 | Stryer | 331/11 X |

*Primary Examiner*—Siegfried H. Grimm

[57] ABSTRACT

A phase and frequency detector circuit includes both a phase comparator such as an exclusive-OR gate possessing high phase sensitivity, and a frequency-phase comparator that is sensitive to differences in frequency. The outputs of these circuits are combined to provide a single output signal offering both frequency discrimination and sharp phase discrimination.

37 Claims, 6 Drawing Sheets

PHASE AND FREQUENCY COMPARATOR CIRCUIT FOR PHASE LOCKED LOOP

BACKGROUND OF THE INVENTION

This invention relates to a phase and frequency detector circuit, more particularly to a phase and frequency detector circuit used in a phase-locked loop in, for example, the local oscillator of a frequency converter.

Phase detectors are essential components of phase-locked loops, which are widely used for frequency control in electronic communication, navigation and computer systems. A phase detector responds to the difference in phase, or in frequency and phase, between an input signal and a reference signal and generates an output signal that varies depending on this difference. In a phase-locked loop, the phase detector output controls the frequency of a voltage-controlled oscillator, the output of which is fed back to the phase detector as an input signal. In this way the phase detector causes the voltage-controlled oscillator to lock onto the frequency of the reference signal. Alternatively, a divider, such as a programmable divider, can be inserted in the feedback loop to have the voltage-controlled oscillator to lock onto a desired multiple of the reference frequency.

Two well-known examples of prior-art phase detectors are the R-S flip-flop circuit and the exclusive-OR gate. Both the exclusive-OR gate and the R-S flip-flop, however, suffer from the disadvantage of being unable to discriminate frequency. A resulting problem in phase-locked loops is that the loop tends to lock to harmonics of the reference frequency unless an additional device such as a sweep oscillator circuit is provided to match the frequencies of the reference signal and input signal.

Prior-art phase detectors capable of discriminating frequency as well as phase have been configured using, for example, D flip-flops. A problem with such circuits, however, is that they sacrifice gain (with respect to phase). Accordingly, they are unsuitable for use in phase-locked loops that must operate at low levels of phase noise.

SUMMARY OF THE INVENTION

An object of the present invention is to solve the preceding problems and provide a phase and frequency detector circuit that combines high gain with respect to the phase of the input signal with the ability to discriminate frequency. A phase and frequency detector circuit according to this invention comprises a phase comparator for receiving a first input signal and a second input signal and generating a signal that varies depending on their phase difference, a phase-frequency comparator for receiving the first input signal and the second input signal and generating a signal that varies depending on their phase and frequency difference, and a merging circuit for combining the signals generated by the phase comparator and the phase-frequency comparator and providing the result as an output signal.

DETAILED DESCRIPTION OF THE EMBODIMENTS

Figure 1:
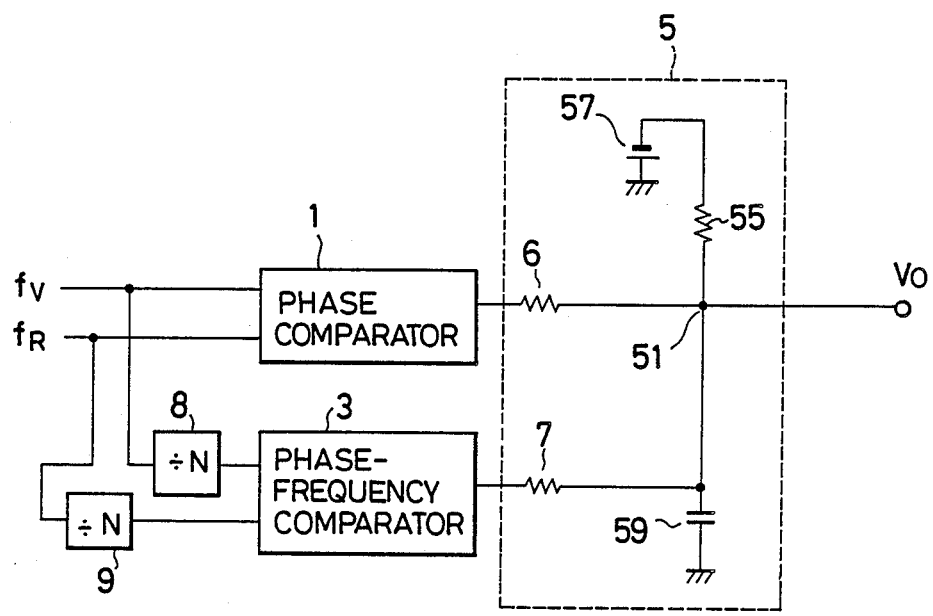
FIG. 1 is a block diagram of a phase and frequency detector circuit embodying the present invention.

An embodiment of the invention will be described with reference to FIGS. 1 through 5. As illustrated in FIG. 1, a phase and frequency detector circuit according to this embodiment comprises a phase comparator 1 which generates a signal $V_1$, frequency dividers 8 and 9, a phase-frequency comparator 3 which generates a signal $V_2$, a merging circuit 5 for receiving and combining the signals $V_1$ and $V_2$ output by the phase comparator 1 and the phase-frequency comparator 3 and producing a synthetic output voltage $V_0$ at a merging node 51. It includes a resistor 6 inserted between the phase comparator 1 and the merging node 51, a resistor 7 inserted between the phase-frequency comparator 3 and the merging node 51.

The phase comparator 1 receives a reference signal $f_R$ and an input signal $f_V$ which are normally close or equal in frequency but may differ in phase. The reference signal $f_R$ and the input signal $f_V$ are also supplied through the frequency dividers 8 and 9 to the phase-frequency comparator 3, so the phase difference between the signals received by the phase-frequency comparator 3 is the same as the phase difference between the signals received by the phase comparator 1, but the frequency of the signals received by the phase-frequency comparator 3 is only 1/N the frequency of the signals received by the phase comparator 1.

The node 51 of the merging circuit 5 is connected through a resistor 55 to a bias power supply 57. The node 51 is also connected through a capacitor 59 to ground. The capacitor 59 acts as a smoothing element, so that the output signal $V_0$ represents the combined average value of the signals $V_1$ output by the phase comparator 1 and $V_2$ output by the phase-frequency comparator 3.

Figure 2:
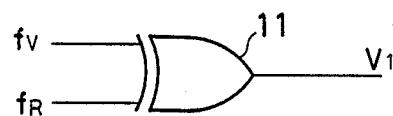
FIG. 2 is a more detailed drawing showing an example of the phase comparator in FIG. 1.
Figure 3:
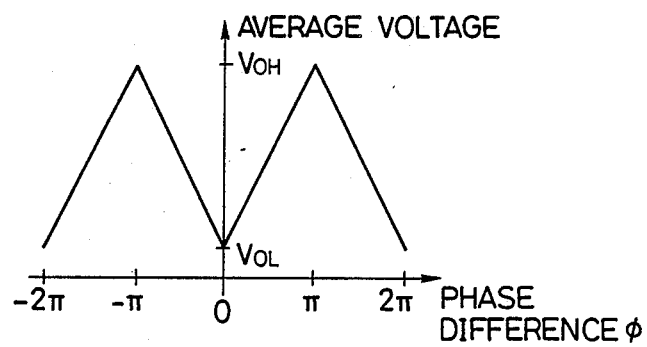
FIG. 3 is a graph illustrating the input-output characteristic of the phase comparator in FIG. 2.

FIG. 2 is a more detailed drawing of an example of the phase comparator 1 in FIG. 1. The comparator 1 in this embodiment comprises an exclusive-OR gate 11. The input-output characteristic of the exclusive-OR gate 11 is illustrated in FIG. 3, in which the phase difference in radians between the input signal $f_V$ and the reference signal $f_R$ is shown on the horizontal axis and the average value of the output signal $V_1$ is shown on the vertical axis for the case in which $f_R$ and $f_V$ are both square-wave signals with a 50% duty ratio and identical frequencies. If they are also identical in phase, the levels of $f_R$ and $f_V$ will always be the same, so the result of an exclusive-OR operation performed on them will always be "0" and the output of the exclusive-OR gate 11 will always be at the Low level $V_{OL}$. If $f_R$ and $f_V$ are out of phase by exactly $\pi$ radians, they will always be at opposite levels, so their exclusive-OR will always be "1" and the output of the exclusive-OR gate 11 will always be at the High level $V_{OH}$. If $f_R$ and $f_V$ are out of phase by an intermediate amount $\phi$, then they will be opposite in level for a time corresponding to $\phi$ radians and equal in level for a time corresponding to $\pi$-$\phi$ radians, so the output of the exclusive-OR gate 11 will be $V_{OH}$ for the time $\phi$ and $V_{OL}$ for the time $\pi$-$\phi$. The average value of the output signal will therefore have the characteristic shown in FIG. 3.

Figure 4:
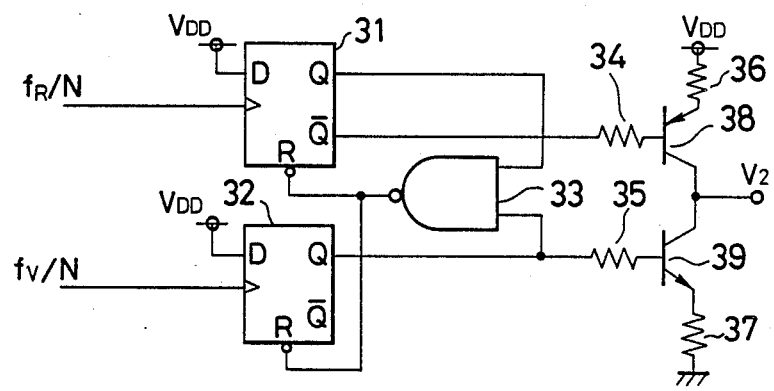
FIG. 4 is a more detailed drawing showing an example of the phase-frequency comparator in FIG. 1.

FIG. 4 shows a more detailed drawing of an example of the phase-frequency comparator 3 in FIG. 1. The circuit in FIG. 4 is a charge-pump type circuit comprising a D flip-flop 31 for receiving the signal $f_R/N$, a D flip-flop 32 for receiving the signal $f_V/N$, a NAND gate 33 for performing a NAND operation on the Q outputs of the D flip-flops 31 and 32 and providing the result to the R inputs of the D flip-flops 31 and 32, a resistor 34 for limiting the $\overline{Q}$ output current of the D flip-flop 31, a resistor 35 for limiting the Q output of the D flip-flop 32, a PNP transistor 38 the base of which is connected through the resistor 34 to the $\overline{Q}$ output of the D flip-flop 31, an NPN transistor 39 the base of which is connected through the resistor 35 to the Q output of the D flip-flop 32, a resistor 36 for limiting the current flow through the PNP transistor 38, and a resistor 37 for limiting the current flow through the NPN transistor 39.

In the initial state, the D flip-flops 31 and 32 are both in the reset state, the base of the PNP transistor 38 receives a positive bias which turns the PNP transistor 38 off, and the base of the NPN transistor 39 receives a negative bias which turns the NPN transistor 39 off. The inputs of the NAND gate 33 are both Low, so the output of the NAND gate 33 is High.

If the input signal $f_V$ precedes the reference signal $f_R$ in phase, the circuit in FIG. 4 operates as follows. When a pulse of the $f_V/N$ signal is received, the D flip-flop 32 sets so that its Q output goes High and its $\overline{Q}$ output goes Low, turning on the NPN transistor 39. Next, when a pulse of the $f_R/N$ signal is received, the D flip-flop 31 sets so that its Q output goes High. Both inputs to the NAND gate 33 are now High, so the output of the NAND gate 33 goes Low, resetting the D flip-flops 31 and 32 to their initial state.

If the reference signal $f_R$ precedes the input signal $f_V$ in phase, when a pulse of the $f_R/N$ signal is received, the D flip-flop 31 sets, turning on the PNP transistor 38, the base of which is negatively biased. Next, when a pulse of the $f_V/N$ signal is received, the D flip-flop 32 sets so that both inputs of the NAND gate 33 are High. The output of the NAND gate 33 accordingly goes Low, resetting the D flip-flops 31 and 32 to their initial state.

Figure 5:
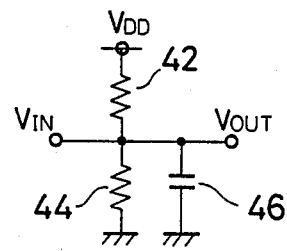
FIG. 5 is a schematic diagram of a circuit which may be used to interface the output of the phase-frequency comparator in FIG. 4.

The phase-frequency comparator in FIG. 4 thus has a three-state output $V_2$, the three states being the high-impedance state in which the PNP transistor 38 and the NPN transistor 39 are both off, the state in which the PNP transistor 38 is on but the NPN transistor 39 is off, and the state in which the PNP transistor 38 is off but the NPN transistor 39 is on. For explanatory purposes it is useful to assume that the output signal $V_2$ is interfaced by a further circuit like that shown in FIG. 5 comprising resistors 42 and 44 and a capacitor 46. The terminal marked $V_{IN}$ in FIG. 5 is connected to the terminal marked $V_2$ in FIG. 4. The resistors 42 and 44 form a voltage divider which determines the output voltage $V_{OUT}$ when the input $V_{IN}$ is in the high-impedance state.

Figure 6:
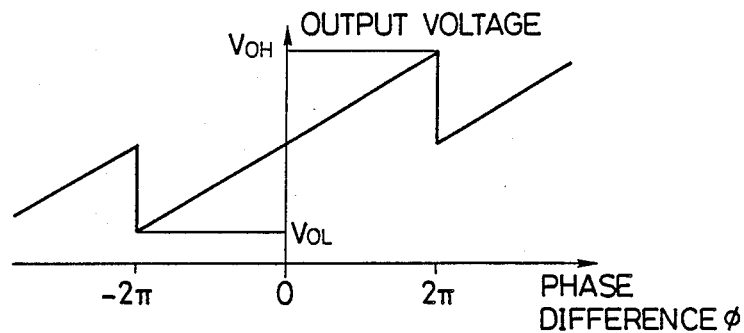
FIG. 6 is a graph illustrating the input-output characteristic of the phase-frequency comparator in FIG. 4.

FIG. 6 is a graph illustrating the input-output characteristic of the circuit in FIG. 4, on the assumption that the output $V_2$ is interfaced by the circuit shown in FIG. 5. The average value of the output signal $V_2$ is plotted on the vertical axis. The phase difference between the input signal $f_V/N$ and the reference signal $f_R/N$ is plotted in radians on the horizontal axis. When the frequencies of the input signal $f_V/N$ and the reference signal $f_R/N$ are equal, as the phase difference $\phi$ between them varies in the range from $-2\pi$ to $2\pi$, at times the PNP transistor 38 alone will be on or the NPN transistor 39 alone will be on, or the PNP transistor 38 and the NPN transistor 39 will both be off depending on whether $f_V/N$ precedes $f_R/N$ or $f_R/N$ precedes $f_V/N$. The average value of the output $V_2$ will vary linearly from $V_{OL}$ to $V_{OH}$ according to the phase difference $\phi$. The sensitivity with which phase is discriminated in FIG. 6 is $(V_{OH}-V_{OL})/4\pi$.

If the input signal $f_V/N$ has a higher frequency than the reference signal $f_R/N$, then every $f_R/N$ pulse will be preceded by an $f_V/N$ pulse, so either the PNP transistor 38 will be off and the NPN transistor 39 will be on, or else both transistors will be off. The average value of $V_2$ will be:

$$[V_{OH}+(V_{OH}+V_{OL})/2]/2=(3V_{OH}+V_{OL})/4$$

If the input signal $f_V/N$ has a lower frequency than the reference signal $f_R/N$, then every $f_V/N$ pulse will be preceded by an $f_R/N$ pulse, so either the PNP transistor 38 will be on and the NPN transistor 39 will be off, or else both transistors will be off. The average value of $V_2$ will be:

$$[V_{OL}+(V_{OH}+V_{OL})/2]/2=(V_{OH}+3V_{OL})/4$$

Thus the phase-frequency comparator 3 can discriminate both phase differences and frequency differences between the input signal $f_V/N$ and the reference signal $f_R/N$, but its phase discrimination sensitivity $(V_{OH}-V_{OL})/4\pi$ is only $\frac{1}{4}$ the phase discrimination sensitivity $(V_{OH}-V_{OL})/\pi$ of the exclusive-OR gate 11 in FIG. 2.

When the reference signal $f_R/N$ and input signal $f_V/N$ have the same frequency, the average level of the output signal $V_0$ is determined mainly by the phase comparator 1, which has the higher gain with respect to phase. When the reference signal $f_R/N$ and input signal $f_V/N$ differ in frequency, however, the output of the phase comparator 1 remains substantially constant at $(V_{OH}-V_{OL})/2$ as explained earlier, so the average level of the output signal $V_0$ is determined mainly by the phase-frequency comparator 3, which discriminates frequency. A phase and frequency detector circuit according to this embodiment accordingly combines the sharp phase sensitivity of the phase comparator 1 with the frequency discrimination capability of the phase-frequency comparator 3.

When a phase comparator and a phase-frequency comparator are fabricated by the same semiconductor process, in general the phase comparator will be able to operate up to higher frequencies, because it is simpler in structure. For example, a phase comparator fabricated by the HS-MOS (High-Speed Metal-Oxide Semiconductor) process can operate at 40 MHz, while an HS-MOS phase-frequency comparator cannot operate above about 10 MHz. Thus the purpose of the dividers 8 and 9, which can be devices such as ECL (emitter-coupled logic) prescalers, is to reduce the frequency of the signals input to the phase-frequency comparator 3 so that it can operate up to the limit set by the phase comparator 1. In apparatus using a low-frequency reference signal, however, the dividers 8 and 9 can be omitted.

Figure 7:
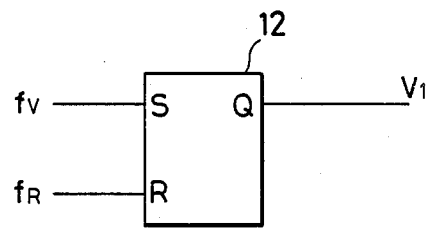
FIG. 7 is a detailed drawing of another example of the phase comparator in FIG. 1.
Figure 8:
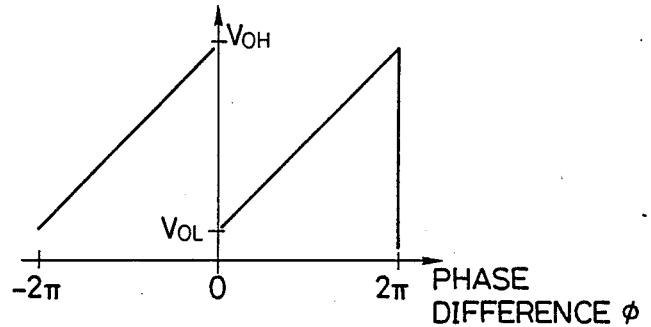
FIG. 8 is a graph illustrating the input-output characteristic of the phase comparator in FIG. 7.

Another example of the phase comparator 1 in FIG. 1, which may be advantageously employed when the duty ratio of the reference signal $f_R$ and input signal $f_V$ differs from 50%, will be described with reference to FIG. 7 and FIG. 8. As shown in FIG. 7, the phase comparator 1 in this embodiment comprises an R-S flip-flop 12, the R input terminal of which receives the reference signal $f_R$ and the S input terminal of which receives the input signal $f_V$. When $f_R$ and $f_V$ have the same frequency, the average level of the output signal $V_1$ does not depend on the duty ratio of $f_R$ and $f_V$ but simply indicates the amount by which $f_V$ precedes $f_R$ in phase. If $f_V$ precedes $f_R$ by only a small amount, the S-R flip-flop 12 will be set for only a short interval in each period of $f_R$, so the average output level will be close to $V_{OL}$. If $f_V$ precedes $f_R$ by a large amount such as nearly $2\pi$, the S-R flip-flop 12 will remain set for nearly the entire $f_R$ period and the average output level will be close to $V_{OH}$. It follows that when the frequencies of $f_V$ and $f_R$ are substantially equal, the average output characteristic will be that shown in FIG. 8. The gain of the average output characteristic with respect to phase difference is $(V_{OH}-V_{OL})/2\pi$.

Figure 9:
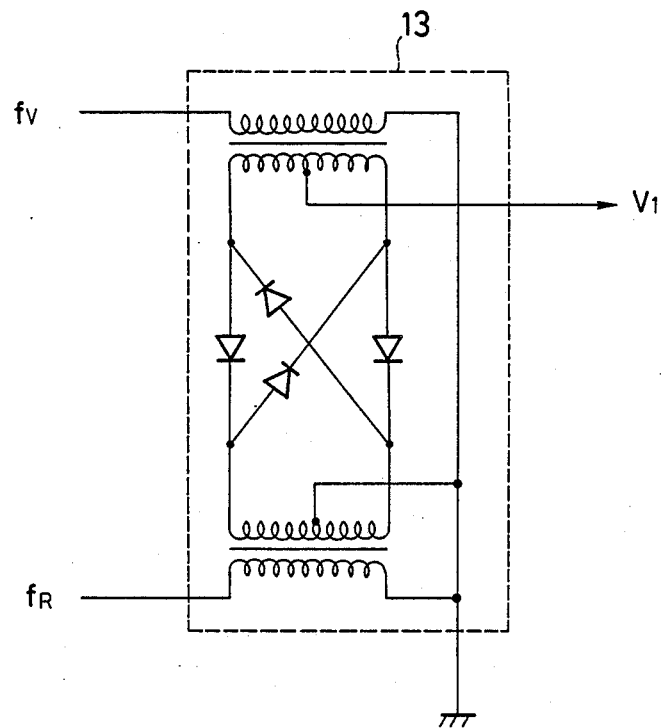
FIG. 9 is a detailed drawing of still another example of the phase comparator in FIG. 1.
Figure 10:
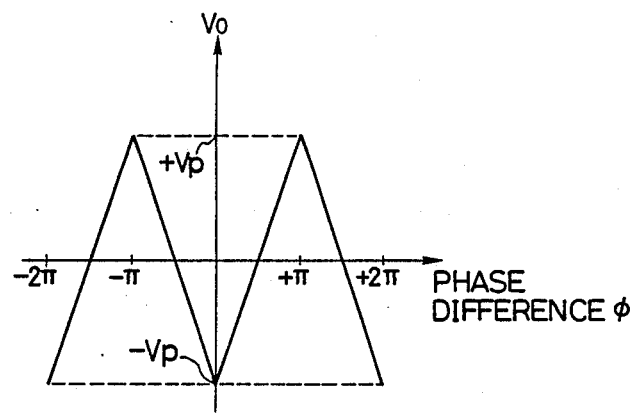
FIG. 10 is a graph illustrating the input-output characteristic of the phase comparator in FIG. 7.

FIG. 9 shows still another example of the phase comparator 1 in FIG. 1 which may be advantageously employed in high-frequency applications for which no suitable exclusive-OR gate or R-S flip-flop is available. In this embodiment the phase comparator 1 is a mixer circuit 13 such as the well-known double-balanced mixer circuit shown in the drawing. FIG. 10 shows the input-output characteristic of this circuit, from which it can be seen that the gain of the average output characteristic with respect to the phase difference between $f_R$ and $f_V$ is $2V_p/\pi$ where $V_p$ denotes the peak value of the beat output of the mixer.

In the preceding embodiments the outputs of the phase comparator 1 and the phase-frequency comparator 3 were merged simply by using parallel resistors. Yet another embodiment of the invention will now be shown in which a high-pass filter such as a lead-lag filter is provided for the output of the phase comparator 1 and a low-pass filter such as a lag-lead filter is provided for the output of the phase-frequency comparator 3. This enables the outputs of the phase comparator 1 and the phase-frequency comparator 3 to be weighted according their frequency.

Figure 11:
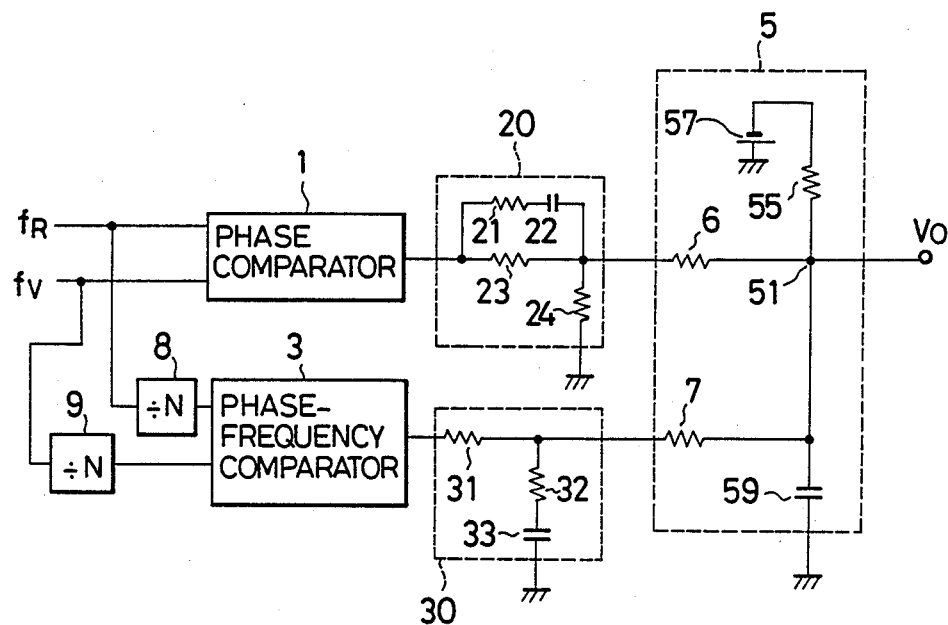
FIG. 11 is a drawing of a phase detector according to another embodiment of the present invention.

A phase and frequency detector circuit according to this embodiment is illustrated in FIG. 11. In addition to the phase comparator 1, the phase-frequency comparator 3, the merging circuit 5, and the dividers 8 and 9 of the first embodiment, the circuit in FIG. 11 comprises a high-pass filter 20 and a low-pass filter 30. The high-pass filter 20 comprises a resistor 21, a capacitor 22, and resistors 23 and 24 connected as illustrated; the low-pass filter 30 comprises resistors 31 and 32 and a capacitor 33 connected as illustrted. The high-pass filter 20 extracts mainly high-frequency signal components in the range from approximately 100 Hz to 1 MHz from the output of the phase comparator 1; the low-pass filter 30 extracts mainly the low-frequency signal components in the range from DC to approximately 100 Hz from the output of the phase-frequency comparator 3. This arrangement reduces phase noise and eliminates undesired DC components in the output $V_0$.

Figure 12:
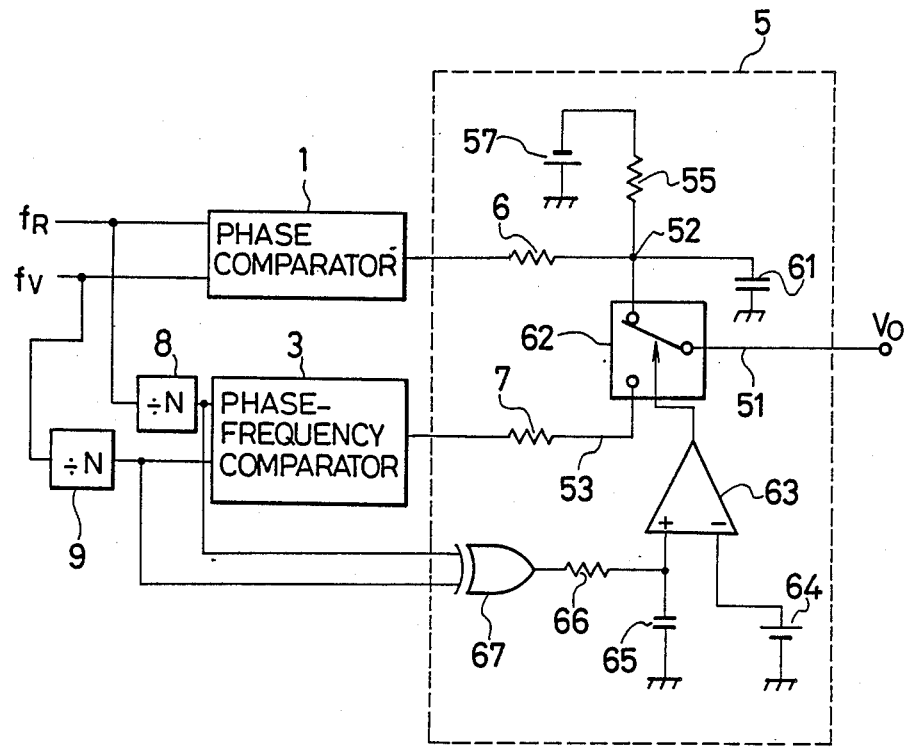
FIG. 12 is a drawing of a phase detector according to yet another embodiment of this invention.

FIG. 12 shows another embodiment of this invention, differing from the preceding embodiments in the configuration of the merging circuit 5. Instead of using resistors to combine the outputs $V_1$ and $V_2$ of the phase comparator 1 and the phase-frequency comparator 3 as in the preceding embodiments, this embodiment uses a switch to select either $V_1$ or $V_2$. The switch is controlled so that the output signal $V_0$ comprises the output $V_1$ of the phase comparator 1 when the input signal and reference signal have the same frequency, and the output $V_2$ of the phase-frequency comparator 3 when the input signal and reference signal have different frequencies.

In this embodiment, the output $V_1$ of the phase comparator 1 is brought through the resistor 6 to the node 52, which is connected through the resistor 55 to the bias power supply 57 as in the embodiments already described. The node 52 is also coupled to ground through a capacitor 61 which acts as a smoothing element, and to one input terminal of an analog switch 62. The other input terminal of the analog switch 62 receives the output signal $V_2$ from the phase-frequency comparator 3 through the resistor 7. The output terminal of the analog switch 62 provides the output signal $V_0$.

The analog switch 62 is controlled by the output of a comparator 63. One input terminal of the comparator 63 is coupled to a reference voltage source 64 which provides a voltage $(V_{OH}+3V_{OL})/4$ midway between $(V_{OH}+V_{OL})/2$ and $V_{OL}$. The other input terminal of the comparator 63 is coupled through a capacitor 65 to ground, and is also coupled through a resistor 66 to the output terminal of an exclusive-OR gate 67 which receives the output signals of the dividers 8 and 9.

The output of the exclusive-OR gate 67 is constantly Low when the input signal $f_V$ is in phase with the reference signal $f_R$, and cycles repetitively between the High and Low levels when the input signal and reference signal have different frequencies. In a phase-locked loop, these states are referred to as the locked state and the unlocked state, respectively. The output of the exclusive-OR gate 67 is smoothed by the resistor 66 and the capacitor 65 and compared by the comparator 63 with the voltage generated by the reference voltage source 64. When the input signal $f_V$ is in the locked state, the comparator 63 drives the analog switch 62 to the position shown in the drawing, in which the phase comparator 1 is connected to the output terminal $V_0$. When the input signal $f_V$ is in the unlocked state, the comparator 63 drives the analog switch 62 to the opposite position, in which the phase-frequency comparator 3 is connected to the output terminal $V_0$. That is, the phase-frequency comparator is used for frequency capturing and the phase comparator 1 is used to maintain frequency and phase lock.

In all of the preceding embodiments, the purpose of the resistor 55 and the bias power supply 57 in the merging circuit 5 is to add a small DC offset to the output signal $V_0$. In a phase-locked loop, such an offset can be used to adjust the phase relationship between the feedback signal (the input signal $f_V$) and the reference signal $f_R$ in the locked state. Preferably, the offset value should be selected so that the loop locks when the phase difference between the signals is greater than 0 radians but a positive value les than $\pi/2$ radians. Such an offset will improve the stability of the locked state and help to minimize spurious output. If this type of phase difference adjustment is not needed, the resistor 55 and the bias power supply 57 can be eliminated.

The scope of this invention is not limited to the embodiments described above but includes many modifications and variations which will be obvious to one skilled in the art. The phase-frequency comparator 3, for example, can be configured in various ways different from that shown in FIG. 4. Some of these configurations provide a lock detect output signal which can be used to control the switch 62 in FIG. 12. The switch 62 in FIG. 12 need not be an analog switch, but can be a relay switch or other type of switch.

What is claimed is:

1. A phase and frequency detector circuit, comprising:
    phase comparator means for receiving a first input signal and a second reference input signal and generating a signal that varies depending on their phase difference;
    frequency dividing means for frequency-dividing, by the same factor N, said first input signal and said second reference input signal;
    phase-frequency comparator means for receiving the outputs of said frequency dividing means and generating a signal that varies depending on the frequency difference and phase difference of the outputs of said frequency dividing means; and
    merging means for receiving the signals generated by said phase comparator means and said phase-frequency comparator means and providing a resultant output signal.

2. A phase and frequency detector circuit according to claim 1, further comprising:
    high-pass filter means inserted between said phase comparator means and said merging means, for selecting high-frequency components in the signal generated by said phase comparator means; and
    low-pass filter means inserted between said phase-frequency comparator means and said merging means, for selecting low-frequency components in the signal generated by said phase-frequency comparator means.

3. A phase and frequency detector circuit according to claim 2, wherein said high-frequency components are between substantially 100 Hz and substantially 10 MHz and said low-frequency components are between substantially DC and substantially 100 Hz.

4. A phase and frequency detector circuit according to claim 1, wherein said phase and frequency detector circuit is used in a phase-locked loop circuit, said merging means selects the signal generated by said phase-frequency comparator means as said resultant output signal while said phase-locked loop is in an unlocked state, and said merging means selects the signal generated by said phase comparator means as a resultant output signal after a locked state is attained.

5. A phase and frequency detector circuit according to claim 1, wherein said phase and frequency detector circuit is used in a phase-locked loop in which said first input signal is a feedback signal and said merging means further comprises a bias power supply for adding a small DC offset to said output signal so as to cause said phase-locked loop to lock when the phase difference between said feedback signal and said second reference input signal is greater than 0 radians but a positive value less than $\pi/2$ radians.

6. A phase and frequency detector circuit according to claim 1, wherein said phase comparator means comprises an exclusive-OR gate.

7. A phase and frequency detector circuit according to claim 1, wherein said phase comparator means comprises an R-S flip-flop.

8. A phase and frequency detector circuit according to claim 1, wherein said phase comparator means comprises a mixer circuit.

9. A phase and frequency detector circuit according to claim 1, wherein said merging means combines said signals generated by said phase comparator means and said phase-frequency comparator means to form said resultant output signal.

10. A phase and frequency detector circuit, used in a phase-locked loop circuit, comprising:
    phase comparator means for receiving a first input signal and a second reference input signal and generating a signal that varies depending on their phase difference;
    phase-frequency comparator means for receiving said first input signal and said second reference input signal and generating a signal that varies depending on their frequency difference and their phase difference; and
    merging means for receiving the signals generated by said phase comparator means and said phase-frequency comparator means and providing a resultant output signal, said merging means including,
    an output node upon which said resultant output signal is provided,
    a first resistor for coupling said output node with a first input terminal, for recieving the signal generated by said phase comparator means,
    a second resistor for coupling said output node with a second input terminal, for receiving the signal generated by said phase-frequency comparator means,
    a third resistor for coupling said output node with a power supply, and
    a smoothing capacitor for coupling said output node with the ground.

11. A phase and frequency detector circuit, as claimed in claim 10,
    wherein said merging means selects the signal generated by said phase-frequency comparator means as said resultant output signal while said phase-locked loop is in an unlocked state, and said merging means selects the signal generated by said phase comparator means as said resultant output signal after a locked state is attained.

12. A phase and frequency detector circuit according to claim 11, further comprising:
    high-pass filter means inserted between said phase comparator means and said merging means, for selecting high-frequency components in the signal generated by said phase comparator means; and
    low-pass filter means inserted between said phase-frequency comparator and said merging means, for selecting low-frequency components in the signal generated by said phase-frequency comparator means.

13. A phase and frequency detector circuit according to claim 12, wherein said high-frequency components are between substantially 100 Hz and substantially 10

MHz and said low-frequency components are between substantially DC and substantially 100 Hz.

14. A phase and frequency detector circuit according to claim 11, wherein said phase and frequency detector circuit is used in a phase-locked loop in which said first input signal is a feedback signal and said merging means further comprises a bias power supply for adding a small DC offset to said output signal so as to cause said phase-locked loop to lock when the phase difference between said feedback signal and said second reference input signal is greater than 0 radians but a positive value less than $\pi/2$ radians.

15. A phase and frequency detector circuit according to claim 11, wherein said phase comparator means comprises an exclusive-OR gate.

16. A phase and frequency detector circuit according to claim 11, wherein said phase comparator means comprises an R-S flip-flop.

17. A phase and frequency detector circuit according to claim 11, wherein said phase comparator means comprises a mixer circuit.

18. A phase and frequency detector circuit, as claimed in claim 10, wherein said resultant output signal obtained at said output node represents the combined average value of the signal output by said phase comparator means and the signal output by said phase-frequency comparator means.

19. A phase and frequency detector circuit, comprising:
   phase comparator means for receiving a first input signal and a second reference input signal and generating a signal that varies depending on their phase difference;
   phase-frequency comparator means for receiving said first input signal and said second reference input signal and generating a signal that varies depending on their frequency difference and their phase difference;
   merging means for receiving the signals generated by said phase comparator means and said phase-frequency comparator means and providing a resultant output signal;
   high-pass filter means inserted between said phase comparator means and said merging means, for selecting high-frequency components in the signal generated by said phase comparator means; and
   low-pass filter means inserted between said phase-frequency comparator means and said merging means, for selecting low-frequency components in the signal generated by said phase-frequency comparator means.

20. A phase and frequency detector circuit according to claim 19, wherein said high-frequency components are between substantially 100 Hz and substantially 10 MHz and said low-frequency components are between substantially DC and substantially 100 Hz.

21. A phase and frequency detector circuit according to claim 19, wherein said phase and frequency detector circuit is used in a phase-locked loop circuit, said merging means selects the signal generated by said phase-frequency comparator means as said resultant output signal while said phase-locked loop is in an unlocked state, and said merging means selects the signal generated by said phase comparator means as said resultant output signal after a locked state is attained.

22. A phase and frequency detector circuit according to claim 19, wherein said phase and frequency detector circuit is used in a phase-locked loop in which said first input signal is a feedback signal and said merging means further comprises a bias power supply for adding a small DC offset to said output signal so as to cause said phase-locked loop to lock when the phase difference between said feedback signal and said second reference input signal is greater than 0 radians but a positive value less than $\pi/2$ radians.

23. A phase and frequency detector circuit according to claim 19, wherein said phase comparator means comprises an exclusive-OR gate.

24. A phase and frequency detector circuit according to claim 19, wherein said phase comparator means comprises an R-S flip-flop.

25. A phase and frequency detector circuit according to claim 19, wherein said phase comparator means comprises a mixer circuit.

26. A phase and frequency detector circuit according to claim 19, further comprising frequency dividers for frequency-dividing, by the same factor N, said first input signal and said second reference input signal, prior to said phase-frequency comparator means receiving said first input signal and said second reference input signal.

27. A phase and frequency detector circuit according to claim 19, wherein said merging means combines said signals generated by said phase comparator means and said phase-frequency comparator means to form said resultant output signal.

28. A method of producing a signal indicative of phase and frequency difference between an input signal and a reference signal, for use in a phase-locked loop circuit, comprising the steps of:
   comparing said input signal and said reference signal in a phase comparator means and generaing a signal that varies depending on their phase difference;
   frequency-dividing, by the same factor N, said input signal and said reference signal;
   comparing said frequency-divided input and reference signals in a phase-frequency comparator means and generating a signal that varies depending on their phase difference and their frequency difference; and
   receiving the signals generated by said phase comparator means and said phase-frequency comparator means in a merging means and said merging means providing a resultant output signal.

29. A method according to claim 28, further comprising the steps of:
   selecting high-frequency components in the signal generated by said phase comparator means, prior to said merging means receiving the signals, by using a high-pass filtering means so as to reduce phase noise in the resultant output signal; and
   selecting low-frequency components in the signal generated by said phase-frequency comparator means, prior to said merging means receiving the signals, by using a low-pass filtering means so as to eliminate undesired DC components in the resultant output signal.

30. A method according to claim 29, wherein said high-frequency components are between substantially 100 Hz and substantially 10 MHz and said low-frequency components are between substantially DC and substantially 100 Hz.

31. A method according to claim 29, further comprising the steps of:
   selecting the signal generated by said phase-frequency comparator means as said resultant output signal provided by said merging means, while said phase-locked loop is in the unlocked state, and selecting the signal generated by said phase comparator means as said resultant output signal provided by said merging means, after the locked state is attained.

32. A method according to claim 28, wherein said merging means combines said received signals to form said resultant output signal.

33. A method of producing a signal indicative of phase and frequency difference between an input signal and a reference signal, for use in a phase-locked loop circuit, comprising the steps of:

comparing said input signal and said reference signal in a phase comparator means and generating a signal that varies depending on their phase difference;

comparing said input signal and said reference signal in a phase-frequency comparator means and generating a signal that varies depending on their phase difference and their frequency difference;

selecting high-frequency components in the signal generated by said phase comparator means by using a high-pass filtering means so as to reduce phase noise occurring between the input signal and the reference signal during said comparison by said phase comparator means; and selecting low-frequency components in the signal generated by said phase-frequency comparator means by using a low-pass filtering means so as to eliminate undesired DC components in the input signal and reference signal which may have remained during said comparison by said phase-frequency comparator means;

receiving the signals selected by said high-pass and low-pass filtering means in a merging means, and said merging means providing a resultant output signal.

34. A method according to claim 33, wherein said high-frequency components are between substantially 100 Hz and substantially 10 MHz and said low-frequency components are between substantially DC and substantially 100 Hz.

35. A method according to claim 33, further comprising the steps of:

selecting the signal generated by said phase-frequency comparator means as said resultant output signal provided by said merging means, while said phase-locked loop is in the unlocked state, and selecting the signal generated by said phase comparator means as said resultant output signal provided by said merging means, after the locked state is attained.

36. A method according to claim 33, furhter comprising the steps of:

frequency-dividing, by the same factor N, said input signal and said reference signal prior to said phase-frequency comparator means comparing said input signal and said reference signal.

37. A method according to claim 33, wherein said merging means combines said received signals to form said resultant output signal.

* * * * *